US011912577B2

(12) United States Patent
Shao

(10) Patent No.: US 11,912,577 B2
(45) Date of Patent: Feb. 27, 2024

(54) METHOD OF FABRICATING A TWO DIMENSIONAL MEMBRANE WITH PERIODIC NANOPORES

(71) Applicant: Lin Shao, College Station, TX (US)

(72) Inventor: Lin Shao, College Station, TX (US)

(73) Assignee: The Texas A&M University System, College Station, TX (US)

( * ) Notice: Subject to any disclaimer, the term of this patent is extended or adjusted under 35 U.S.C. 154(b) by 94 days.

(21) Appl. No.: 17/525,873

(22) Filed: Nov. 13, 2021

(65) Prior Publication Data

US 2022/0153586 A1    May 19, 2022

Related U.S. Application Data

(60) Provisional application No. 63/113,641, filed on Nov. 13, 2020.

(51) Int. Cl.
| | |
|---|---|
| *C01B 32/186* | (2017.01) |
| *C02F 1/44* | (2023.01) |
| *H01L 29/16* | (2006.01) |
| *H01L 29/423* | (2006.01) |
| *G01N 27/414* | (2006.01) |
| *B82Y 40/00* | (2011.01) |

(52) U.S. Cl.
CPC ............ *C01B 32/186* (2017.08); *C02F 1/442* (2013.01); *G01N 27/4146* (2013.01); *H01L 29/1606* (2013.01); *H01L 29/42356* (2013.01); *B82Y 40/00* (2013.01); *C01P 2004/13* (2013.01); *C01P 2004/64* (2013.01); *C01P 2006/16* (2013.01)

(58) Field of Classification Search
CPC ..... C01B 32/186; C01B 32/194; C02F 1/442; C02F 1/441; C02F 2103/08; C02F 2305/08; G01N 27/4146; G01N 27/4141; H01L 29/1606; H01L 29/42356; B82Y 40/00; B82Y 30/00; C01P 2004/13; C01P 2004/64; C01P 2006/16
See application file for complete search history.

(56) References Cited

PUBLICATIONS

Zhao, et al., Drilling Nanopores in Graphene with Clusters: A Molecular Dynamics Study, J. Phys. Chem. C 2012; 116: 11776-11782 (Year: 2012).*
Sanz, et al., Well-ordered nanopore arrays in rutile TiO2 single crystals by swirl heavy ion-beam lithography, Nanotechnology 2007; 18: 305303, pp. 1-6 (Year: 2007).*

* cited by examiner

*Primary Examiner* — Daniel C. McCracken
(74) *Attorney, Agent, or Firm* — Benjamin Aaron Adler

(57) ABSTRACT

Provided herein are methods for creating or fabricating nanopore(s) on a membrane. The membrane is bombarded by ions, for example, C60 ions through at least one nanotunnel through a mask that is positioned on the membrane. Also provided is a two dimensional membrane with at least one nanopore thereon fabricated via these methods.

13 Claims, 8 Drawing Sheets

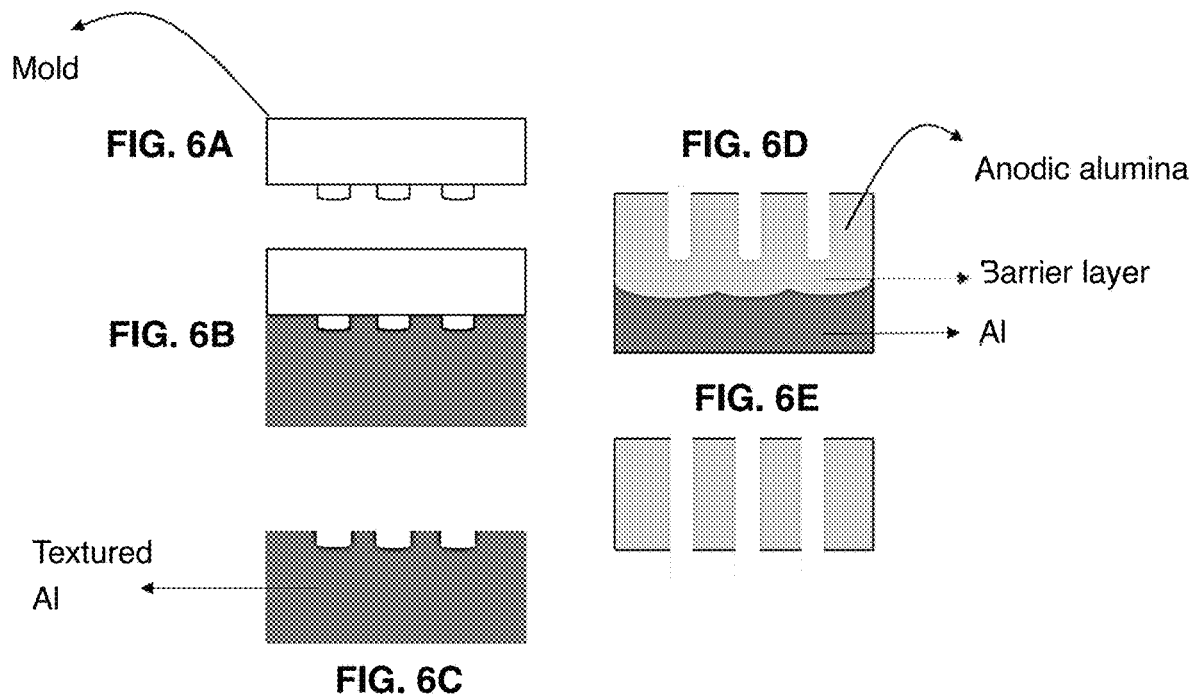
FIG. 6A
FIG. 6B
FIG. 6C Textured Al
FIG. 6D Anodic alumina
FIG. 6E Barrier layer, Al
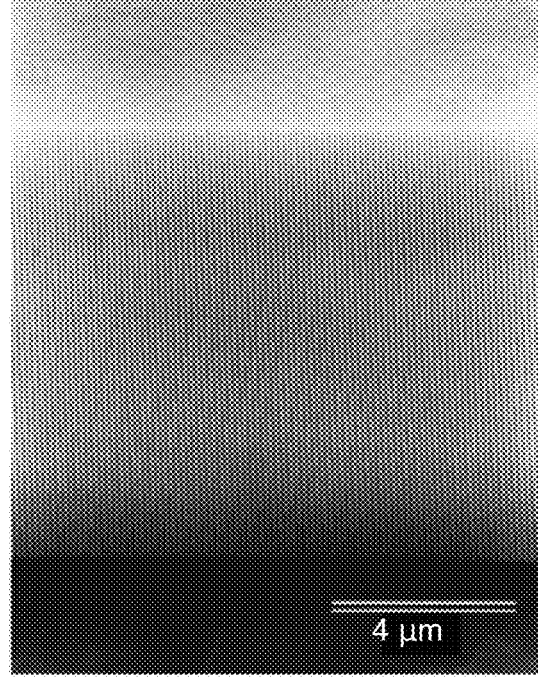
FIG. 6F
4 μm

METHOD OF FABRICATING A TWO DIMENSIONAL MEMBRANE WITH PERIODIC NANOPORES

CROSS-REFERENCE TO RELATED APPLICATIONS

This non-provisional claims benefit of priority under 35 U.S.C. § 119(e) of provisional application U.S. Ser. No. 63/113,641, filed Nov. 13, 2020, the entirety of which is hereby incorporated by reference.

BACKGROUND OF THE INVENTION

Field of the Invention

The present invention relates to the fabrication of two dimensional nanomaterials with nanopores and its applications in the fields of molecular detection or separation. More particularly, the present invention relates to a method for fabricating a two dimensional membrane with one or more nanopores formed thereon as a periodic array.

Description of the Related Art

Forming nanopores on a two-dimensional membrane has a wide range of applications. Examples including DNA sequencing (1), chemical sensing (2), gas separation (3), seawater desalination (4,5) and water purification (to remove virus including coronavirus). All these applications requires a nanometer scale or sub-nanometer scale modification of graphene. Various methods have been used to create nanopores, including drilling a nanopore by using the highly focused electron beam of a transmission electron microscope (1), using hydrothermal steaming to create defects and grow defects into pores (2), using ultraviolet to induce oxidative etching (3), using ion bombardment and subsequent chemical oxidation to growth vacancies into nanopores (4).

However, they cannot be used to form periodic nanopores. Furthermore, the pore size and pore edge quality are two major challenges for each method. The irregularity of pore shapes and the roughness of the pore edge, particularly the latter one, significantly influence the pore functions in all applications. The carbon dangling bands after swift ion irradiation easily induce attachment of hydrocarbon molecules (contaminants easily exist in vacuum systems), leading to sealing of the pore. This contaminant sealing applies to electron beam based drifting as well unless the pore size is very large.

One way to create a periodic nanopore array is to use a mask having patterned nanotunnels. Upon ion irradiation using "traditional" ions, the mask blocks unwanted ions, but allows ions impinging on tunnel openings to pass through, thus creating a pattern on the membrane at the tunnel exit. The method, however, is unrealistic for use via tunnel fabrication due to the required extremely high aspect ratio of the tunnel (length divided by width). For periodic pores of high spatial resolution, the tunnel sizes should be <100 nanometers. The tunnel length (mask thickness) needs to be >20 microns, considering manufacturing feasibility and structural strength required for self-suspension. This corresponds to an aspect ratio of 200. It also requires, in order to let such ions to pass through the tunnel without stopping, the tunnel misalignment tolerance from the mask's normal direction must be only 0.3 degrees (the inverse of the aspect ratio), which is technically impossible currently.

Tunnels with extremely high aspect ratios (ratio of length/diameter >100) are difficult to guarantee perfect alignment and perfect straightness. This excludes the use of "traditional" ions for site-selective bombardment after ions exit from the mask. Here, "traditional" ions include monomer ions (like $H^+$, $Ar^+$), small cluster ions (like $H_2^+$, $C_6^+$), or gas cluster ions ($Ar_{3000}^+$). All have the same problem: once they hit a solid surface even at a small angle, these monomer ions and cluster ions will be implanted into the tunnel surface, or collapsed or scattered into fragments within the tunnel. In order to avoid being destroyed, the tunnel misalignment tolerance must be smaller than the inverse of the tunnel's aspect ratio. A tunnel diameter of 100 nm in a mask of 20-micron thickness means that projectile ions will be blocked if the tunnel axis deviates from the normal at an angle larger than 0.3°. Reducing film thickness can reduce the required aspect ratio but a thickness of 10 microns is probably the lowest thickness for a metal film having sufficient mechanical strength for scalable processing. So far, there is no demonstration of controllable pore arrays on two-dimensional nanomaterials. While focused ion beams are not practical for industry-level scale up as required, for example, in water desalination.

Thus, there is a recognized need in the art for a better method of making a two dimensional nanomaterial with periodic nanopores using a bombarding projectile that survives from being crushed or deformed if it hits the tunnel wall at a glancing angle during fabrication of the nanopores. Particularly, the prior art is deficient in the use of C60 molecules as bombarding particles in the formation of two dimensional membranes with periodic nanopores. The present invention fulfills this long standing need and desire in the art.

SUMMARY OF THE INVENTION

The present invention is directed to method for creating at least one nanopore on a membrane. In the method a mask with at least one nanotunnel therethrough is fabricated and the mask is placed over the membrane. The mask is bombarded with ions and the membrane is bombarded with the ions passing through the at least one nanotunnel, thereby creating the at least one nanopore thereon. The present invention is directed to a related method further comprising the step of adjusting a bombardment energy of the ions to control a size of the at least one nanopore.

The present invention also is directed to a method for fabricating nanopores on a membrane. In the method the membrane is bombarded with C60 ions through at least one nanotunnel formed through a mask positioned thereon, thereby fabricating the nanopores. The present invention is directed to a related method further comprising the step of adjusting a bombardment energy of the C60 ions to control a size of the at least one nanopore.

The present invention is directed further to a two dimensional membrane with at least one nanopore thereon fabricated via the method described herein.

Other and further aspects, features, benefits, and advantages of the present invention will be apparent from the following description of the presently preferred embodiments of the invention given for the purpose of disclosure.

BRIEF DESCRIPTION OF THE DRAWINGS

So that the matter in which the above-recited features, advantages and objects of the invention, as well as others that will become clear, are attained and can be understood in detail, more particular descriptions of the invention briefly summarized above may be had by reference to certain embodiments thereof that are illustrated in the appended drawings. These drawings form a part of the specification. It is to be noted, however, that the appended drawings illustrate preferred embodiments of the invention and therefore are not to be considered limiting in their scope.

FIGS. 6A-6F show the procedures to form an ordered tunnel array including forming ordered convex features on a SiC mold (FIG. 6A), molding onto an Al substrate (FIG. 6B), forming textured Al after removing the mold (FIG. 6C), anodization and growth of alumina (FIG. 6D), removal of the bottom layer to form self-supported mask (FIG. 6E), and a cross-sectional view of channel array inside the alumina, forming by molding and anodization (5) (FIG. 6F).

DETAILED DESCRIPTION OF THE INVENTION

Figure 1:
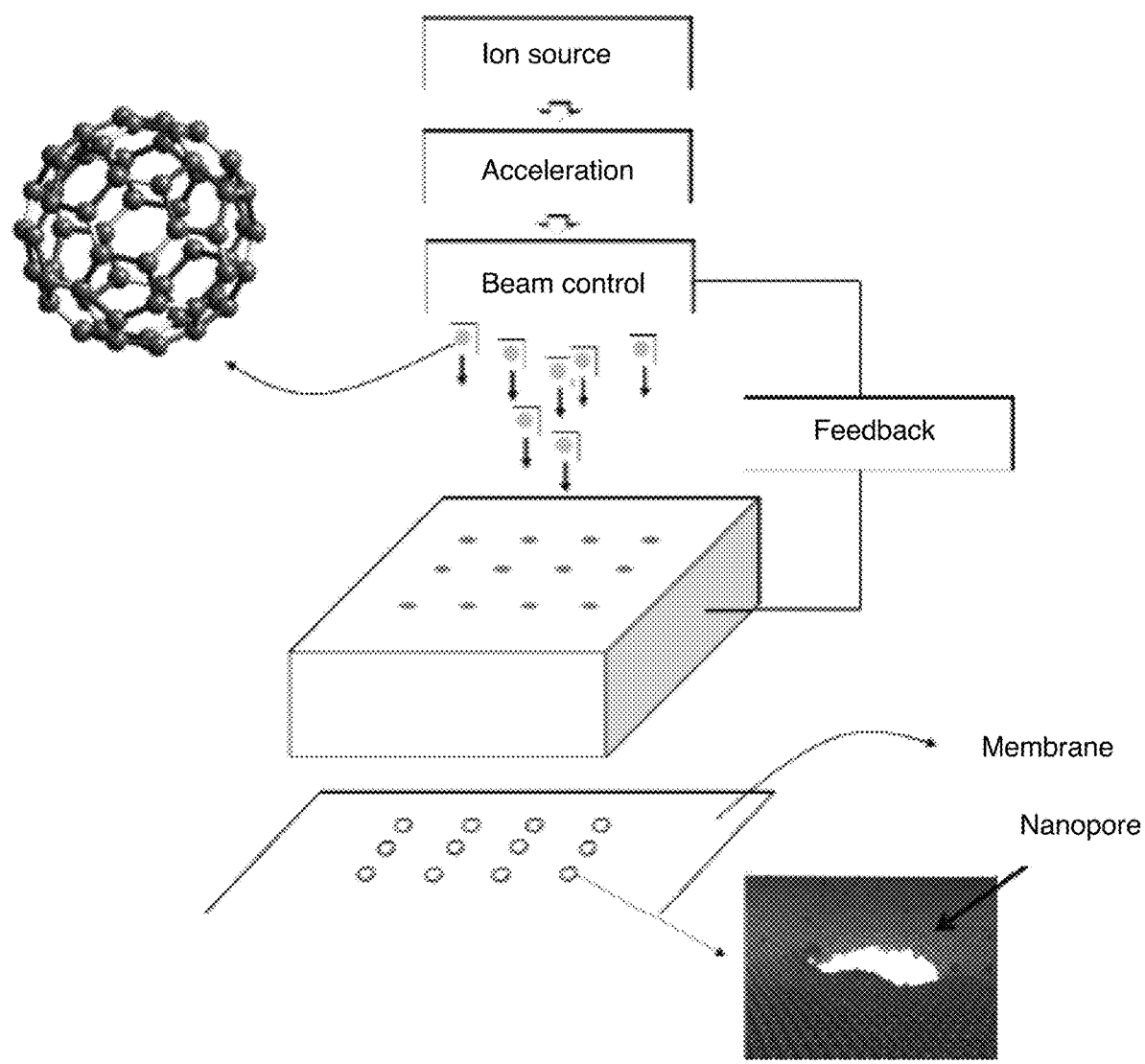
FIG. 1 is a schematic of the key steps to make periodic nanopores in a two-dimensional membrane. Note the $C_{60}$ molecule is channeling through the tunnel.

As used herein in the specification, "a" or "an" may mean one or more. As used herein in the claim(s), when used in conjunction with the word "comprising", the words "a" or "an" may mean one or more than one.

As used herein "another" or "other" may mean at least a second or more of the same or different claim element or components thereof. Similarly, the word "or" is intended to include "and" unless the context clearly indicates otherwise. "Comprise" means "include."

As used herein, the term "about" refers to a numeric value, including, for example, whole numbers, fractions, and percentages, whether or not explicitly indicated. The term "about" generally refers to a range of numerical values (e.g., +1-5-10% of the recited value) that one of ordinary skill in the art would consider equivalent to the recited value (e.g., having the same function or result). In some instances, the term "about" may include numerical values that are rounded to the nearest significant figure.

In one embodiment of the present invention there is provided method for creating at least one nanopore on a membrane, comprising fabricating a mask with at least one nanotunnel therethrough; placing the mask over the membrane; bombarding the mask with ions; and bombarding the membrane with the ions passing through the at least one nanotunnel, thereby creating the at least one nanopore thereon. Further to this embodiment the method comprises adjusting a bombardment energy of the ions to control a size of the at least one nanopore. In this further embodiment the bombardment energy may range from about 100 eV to about 1 MeV.

In both embodiments the fabricating step may comprise forming at least one convex on a mold; molding the mold onto a substrate; and anodizing at each convex to form the at least one nanotunnel. Also in this embodiment the mold may comprise silicon carbide, boron nitride, diamond, stainless steel, glass, a metallic glass, quartz, alumina, or silica.

In both embodiments the membrane may be selected from the group consisting of a single layer graphene, a few-layers graphene and molybdenum disulfide. Also in this embodiment the ions may be charged C60 molecules. In addition the mask may have a thickness of about 1 nm to about 10 mm. Furthermore, the nanotunnel may have an aspect ratio of about 1 to about 10000. Further still, the nanotunnels may be fabricated in a random pattern or as an array.

In another embodiment of the present invention there is provided a method for fabricating nanopores on a membrane, comprising bombarding the membrane with C60 ions through at least one nanotunnel formed through a mask positioned thereon, thereby fabricating the nanopores. Further to this embodiment the method comprises adjusting a bombardment energy of the C60 ions to control a size of the at least one nanopore. In this further embodiment the bombardment energy of the C60 ions may range from about 100 eV to about 10 MeV.

In both embodiments the nanotunnel may have a width of about 0.1 nm to about 1 micron. Also in both embodiments the nanotunnel may have an aspect ratio of about 150.

In yet another embodiment of the present invention there is provided a two dimensional membrane with at least one nanopore thereon fabricated via the method as described supra. In this embodiment the nanopores may be fabricated in a random pattern or as an array on the two dimensional membrane. Also in this embodiment the two dimensional membrane may comprise a filter for seawater desalination or for gas separation or for DNA sequencing. In addition the two dimensional membrane may comprise a sensor for chemical sensing or for gas sensing. Furthermore the two dimensional membrane may comprise a substrate of a graphene field effect transistor.

Provided herein is a method or process to form periodic nanopores on two-dimensional membrane materials by utilizing a mask to block randomly bombarding C60 molecules and allow molecules to pass through at specific locations where nanotunnels are pre-fabricated in the mask. C60 molecule beams are utilized to bombard a membrane to form pores of nanometer sizes. Prior to bombarding the membrane, C60 molecules pass through a mask that has aligned nanotunnels therethrough that define the pore position, i.e., the pattern of the nanopore array, although a single nanopore can be formed on the two dimensional membrane material (FIG. 1).

Particularly, a C60 molecule, incident along a tunnel axial direction, is able to bounce off the internal tunnel surface without crashing into the mask. This enables molecules to exit from the other end of the tunnels even if the tunnels are misaligned or curved from the mask normal. The molecule can follow tunnels over a very long distance without being damaged. For a mask having a patterned tunnel array, the channeling capability of C60 molecules enables creating a periodic collimated molecule beam at the other end of the mask that, when exiting, bombard a two-dimensional membrane to form periodic nanopores thereon.

A mold on which one or a plurality of convexes are formed is used to fabricate the mask. The mold is molded onto a substrate which becomes the mask. The convexes may be periodic on the mold such as in an array. The periodic convexes each may have a height of about 1 nm to about 1 microns and are sized about 1 nm to about 1 micron. The periodic convexes may be spaced apart from its neighboring convex at a distance of about 1 nm to about 1 micron. The mold may be made of materials such as, but not limited to, silicon carbide, boron nitride, diamond, stainless steel, glass, metallic glasses, quartz, alumina, or silica. The mask may be made of materials such as aluminum, nickel, metallic glasses, iron, copper, stainless steels, silicon, germanium, or quartz. The mask may have a thickness of, but not limited to, about 1 nm to about 1 mm.

The convexes are used to direct the formation of nanotunnels via anodizing and growth of tunnels through the mask. The nanotunnels may be fabricated in an array or as a random pattern through the mask. Alternatively, the mask may contain a single nanotunnel therethrough. In a non-limiting example, each nanotunnel may have a width of about 0.1 nm to about 1 micron and an aspect ratio of about 1 to about 10000. A representative aspect ratio is 150.

The membrane may be a thin solid film of a single layer graphene, a few-layers graphene or molybdenum disulfide ($MoS_2$). Ions, for example, but not limited to C60 ions, are directed through the nanotunnel(s) to bombard the membrane resulting in the formation of nanopores thereon. The pattern of the nanopores corresponds to the pattern of the nanotunnels through the mask. The size of the nanopores is controlled by adjusting the bombardment energy of the ions. For example, the energy of the ions may be, but is not limited to, a range of about 100 eV to about 10 MeV.

Also provided is the 2-dimensional membrane having periodic nanopores fabricated by the method described herein. The 2-dimensional membrane as fabricated may be used as sensors or filters such as for, but not limited to, chemical sensing, or a filter for seawater desalination or a filter for removing virus (such coronavirus) or a filter for gas separation or a sensor for gas detection. A two-dimensional membrane having a single nanopore may be used for DNA sequencing. A two dimensional membrane may comprise the substrate of a graphene field effect transistor.

The following examples are given for the purpose of illustrating various embodiments of the invention and are not meant to limit the present invention in any fashion.

Example 1

Methods

Figure 2:
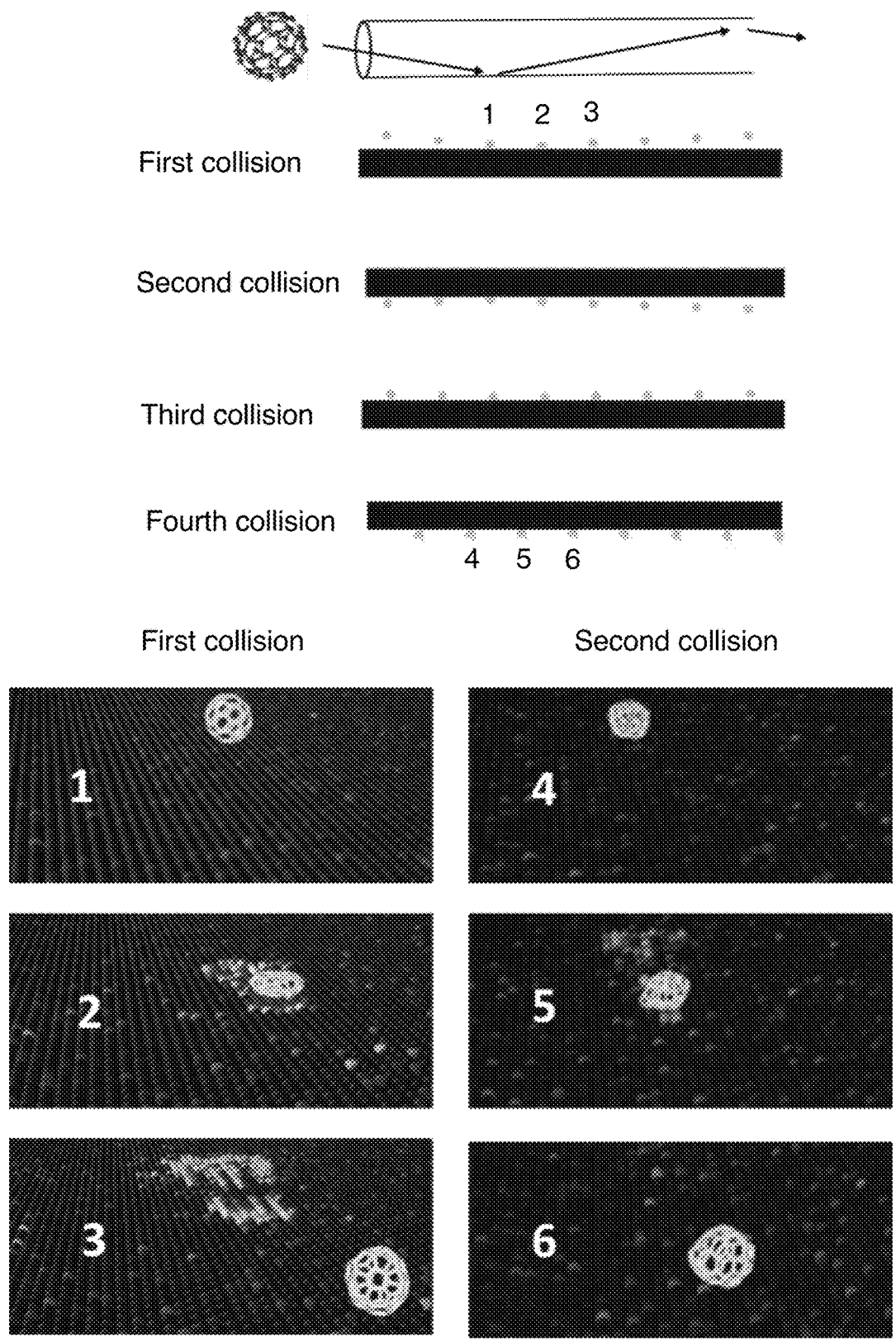
FIG. 2 is a molecular dynamics simulation of a $C_{60}$ molecule transiting an Al tube of 100 nm dimeter at an initial incident angle of 5°. Note that the cage elastically bounces off the wall after each collision.

Non-Destructive Bouncing of $C_{60}$ Molecule in Nanotunnels of a Mask to Form Patterned Projectiles for Nanopore Creation Molecular dynamics simulations, using the Large-scale Atomic/Molecular Massively Parallel Simulator (LAMMPS) code, provides evidence and demonstrates the feasibility of the method. The bombardment of one $C_{60}$ molecule within a 100 nm aluminum tunnel is simulated. The molecule has an initial kinetic energy of 10 keV and an incident angle of 5° away from the tunnel axis. FIG. 2 shows the trajectories of $C_{60}$ molecule bouncing inside the tunnel four times. For each collision, the molecule bounced off the tube wall without being crushed. The points 1, 2, and 3 correspond to before, during, and after the first collision. Note at point 2, the $C_{60}$ cage is compressed flat on the surface. Points 4, 5, and 6 correspond to the case for the fourth collision. The total flying distance by the $C_{60}$ molecule after the fourth collision reaches about 20 microns, which is long enough to exit the required mask thickness. No $C_{60}$ dissociation is observed.

Figure 3:
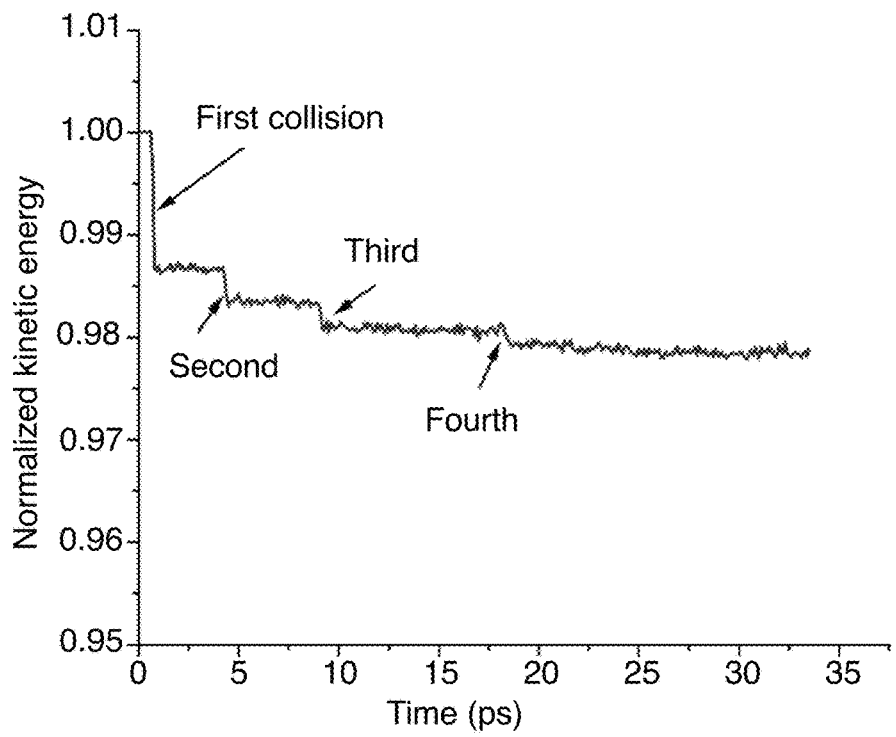
FIG. 3 illustrates the kinetic energy change of a $C_{60}$ molecule transiting an Al tube of 100 nm length at an initial incident angle of 5°, calculated using a molecular dynamics simulation. Only a small fraction of energy (<2%) is lost after each collision.

After each collision, only a very small fraction of the energy is lost. FIG. 3 plots the kinetic energy change of a $C_{60}$ molecule upon collision, normalized to the initial kinetic energy of 10 keV. After four collisions, the total accumulated kinetic energy loss is only about 2%. This means that the $C_{60}$ molecule is still energetic enough to create a damage cascade. Once the molecule exits from the tunnel, it hits the 2-dimensional membrane fully in the normal direction.

Figure 4:
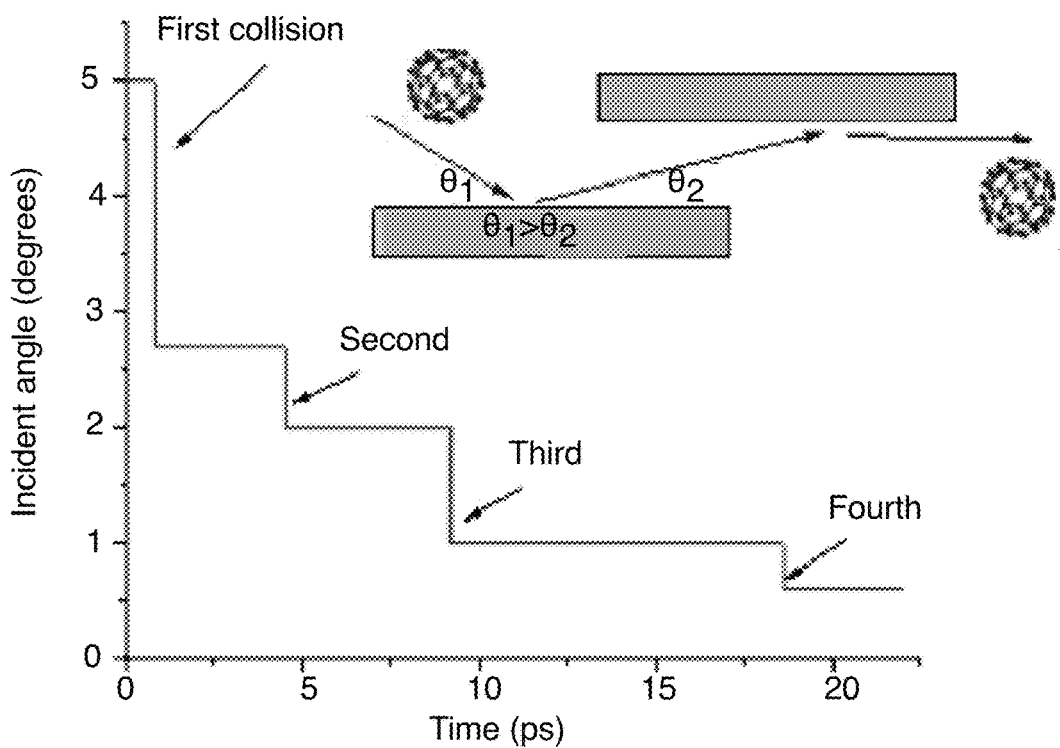
FIG. 4 illustrates the flying angle changes of a $C_{60}$ molecule transiting an Al tube of 100 nm at an initial incident angle of 5°, calculated using molecular dynamics simulations. The flying angle of the molecule approaches to zero after a few collisions.

The transverse momentum the $C_{60}$ is slightly reduced after each collision, but the axial momentum is largely sustained. This results in a slightly reduced exit angle. In other words, after a few bounces, the molecule becomes more and more parallel to the tunnel surface, and the free-flying distance becomes larger due to the reduced exit angle. As shown by FIG. 4, the flying angle of the molecule becomes smaller after each collision. For 10 keV $C_{60}$ incident at 5°, the exit angle after four collisions reduces to 0.6° (FIG. 4). This indicates that the $C_{60}$ molecule can fly through a mask of 50 μm without significant dissociation.

Accelerator for $C_{60}$ Molecule Production

The two types of sources for creating energetic $C_{60}$ molecule beams are an effusion source and a Source of Negative ions by Cesium Sputtering (SNICS) (6,7). The effusion ion source includes an oven containing $C_{60}$ powder. Upon heating to ~400° C., $C_{60}$ clusters are evaporated and then diffuse through a hollow tube to enter the ionization chamber. The chamber includes a Ta plate which emits electrons upon heating. The emitted electrons are accelerated to >100 eV to interact with $C_{60}$, forming positively charged $C_{60}$. The ionized $C_{60}$ clusters are then accelerated through a bias >10 kV, and focused and steered via a series of lenses. In a SNICS source $C_{60}$ molecules are created by Cs sputtering, then focused/accelerated/bent under a magnet for mass purification. The purified $C_{60}^-$ beam is accelerated through an acceleration tank, and bent by another magnet to purify its energy.

Figure 5:
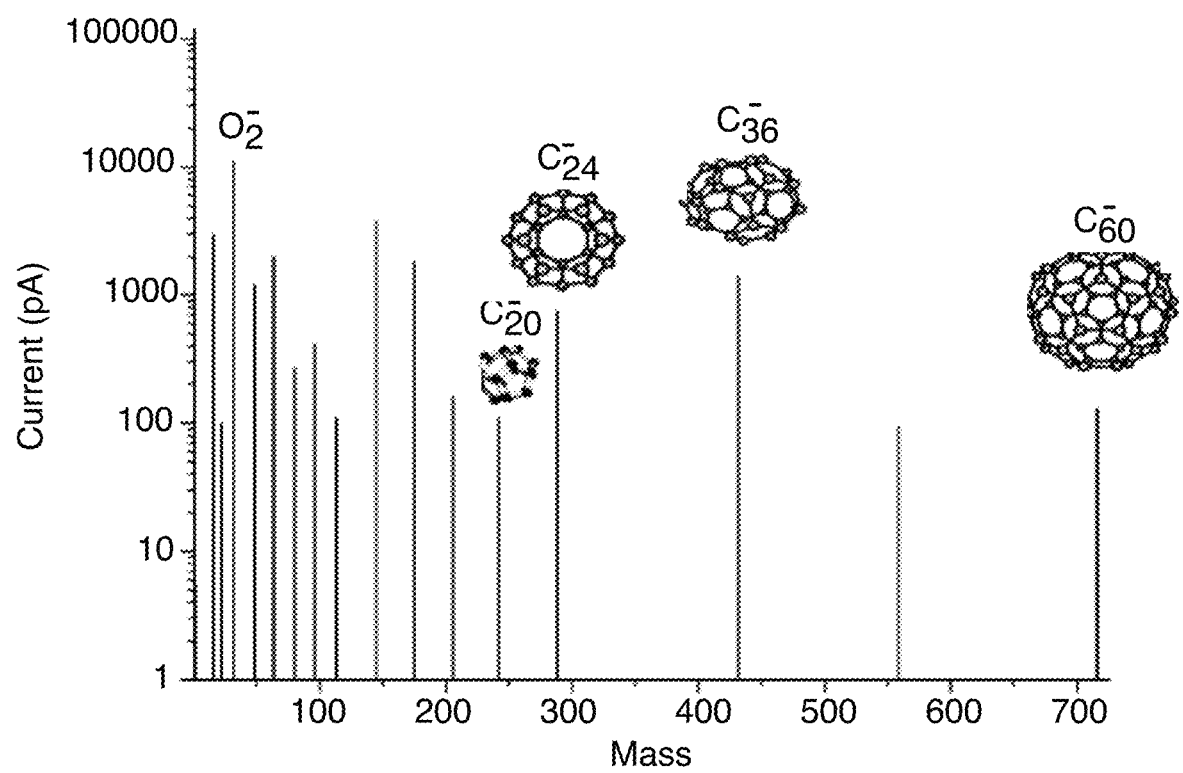
FIG. 5 illustrates the beam current as a function of mass. $C_{60}$ molecules are obtained by evaporating $C_{60}$ powders, ionizing evaporated molecules, accelerating the ionized molecules, and selecting molecules by bending them through a magnetic field.

Molecule beam created from an ion source is often dirty, with a mixture of molecules, fragments of molecules, and contaminants such as O, H, and C. The beam purification can be achieved by using magnets. The charged beam is injected into a chamber inside a magnetic field. Due to mass differences, different molecules are bent with different bending radius. Therefore, adjusting magnetic fields can allow the correct molecule beam to pass through the exit and block other unwanted molecules and contaminants. Such magnetic bending can be used twice to select not only correct molecule mass but also correct molecule energies. FIG. 5 shows our measured beam currents as a function of ion mass. After the selection of correct molecules, charged molecules enter into an accelerator tank to gain kinetic energy controllable by adjusting accelerator terminal voltage. Then the accelerated molecules are bent under another magnetic field to purify the beam energy. Then the molecules are focused or scanned to bombard the mask/substrate.

Preparation of Mask Having Patterned Tunnels

Commercially available templates of tunnel diameter are available from 40 nanometers to 500 nanometers, and with template thickness ≥20 μm (ACS Material, Inc.). In this approach the molding and anodization of a metal or semiconductor film are combined in an appropriate acid. The key is to use a pre-patterned concave array to initialize pores and guide the growth of the tunnels. The technique has been well demonstrated by using Al as the starting substrate. As shown in FIGS. 6A-6F, the process includes preparation of a hard mold with an ordered array of convex features (FIG. 6A), which can be achieved by using a conventional electron-beam lithography technique. In the demonstration, a SiC master of 4×5 mm was used with molding onto the metal surface with sufficient pressure to facilitate deformation and also detachment (FIG. 6B) where a textured metal surface is formed (FIG. 6C) and anodization and growth of the channel architecture in the anodic film occurs (FIG. 6D, 6F). The bottom part of the oxide film is called the barrier layer. Both the barrier layer and non-oxidized Al on the bottom can be removed (FIG. 6E) by using laser cutting. FIG. 5 shows aligned tunnels of 100 nm in the anodic alumina. The tunnel growth exactly follows the pre-patterned concaves. Note the structure reaches a high aspect ratio of about 150. The indentation approach is used to precisely control tunnel morphologies and to achieve high repeatability.

Determination of the Critical Angle for $C_{60}$ Molecule Channeling

Figure 7A:
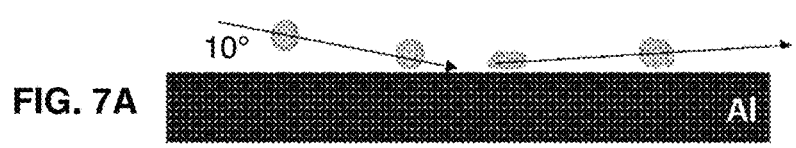
FIGS. 7A-7C are molecular dynamic simulations of a 7 keV $C_{60}$ molecule bombarding Al at 10° (FIG. 7A), 20° (FIG. 7B), and 45° (FIG. 7C). There exits a critical incident angle. Below this angle, $C_{60}$ molecules will be bounced off the surface without being damaged. This angle is about 10° C. for the example shown in the figure. The critical angle depends on $C_{60}$ molecule energy.
Figure 7B:
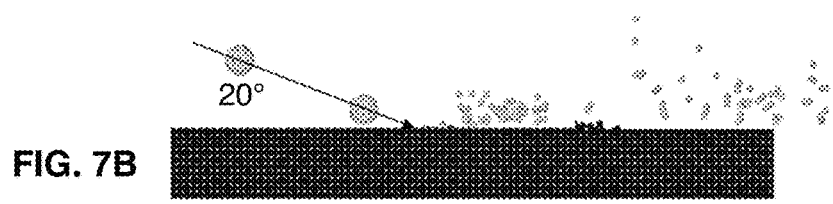
Figure 7C:
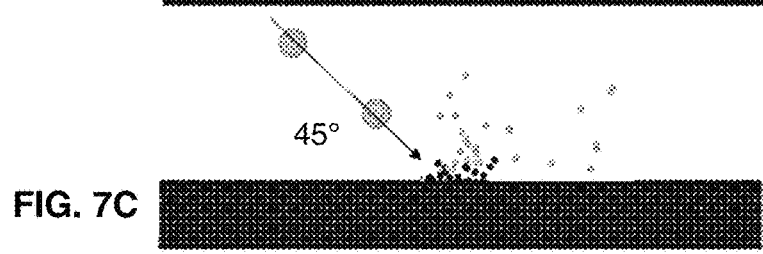

Measurement of $C_{60}$ molecule penetration through tunnels as a function of molecule incident angles determines the critical angle for "channeling". This is done by measuring the beam current received on a current collector positioned behind the mask. The set of the mask and the current collector are positioned on a 5-axis goniometer which rotates and tilts with an angular resolution of 0.01 degree which is routinely used in channeling Rutherford backscattering spectrometry. The beam current should show a dip around the normal direction. The half-width of the dip is the critical angle for channeling. The angle is measured at different incident energies, for example, from 5 keV to 1 MeV. If the susceptibility of molecule collapse is determined by whether the vertical momentum transfer exceeds a threshold value or not, then the critical angle will be reduced with increasing incident energy. However, under extremely high energy, the collision could be a mixture of compression and rotation under glancing angle bombardment. This may reduce the deformation at a fixed landing point and increase the overall deformation tolerance. Hence, the critical angle may be larger at certain high energies. The critical angle and energy dependence will be compared with MD simulation results. FIGS. 7B-7C shows that a 7 keV molecule is crushed with an incident angle 20°. At an angle of 10°, the molecule maintains its integrity and bounces off (FIG. 7A).

Adjusting Pore Sizes by Changing Energy, Angle and Layer Numbers

Figure 8A:
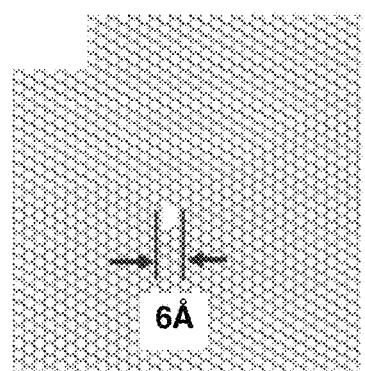
FIGS. 8A-8E are molecular dynamics simulation-predicted pore sizes formed by $C_{60}$ bombardment of 800 keV on a graphene monolayer (FIG. 8A), 10 keV on a graphene monolayer (FIG. 8B), 100 keV on a graphene monolayer (FIG. 8C), 10 keV on a graphene bi-layer (FIG. 8D), and 100 keV on a bi-layer graphene (FIG. 8E). The pore size is controllable by controlling energies.
Figure 8B:
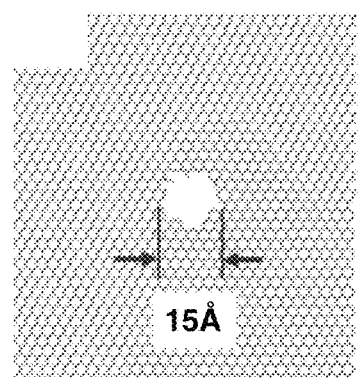
Figure 8C:
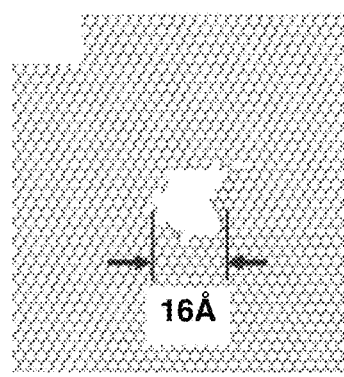
Figure 8D:
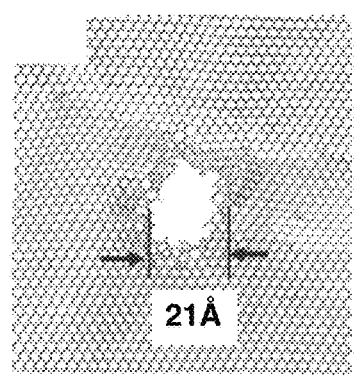
Figure 8E:
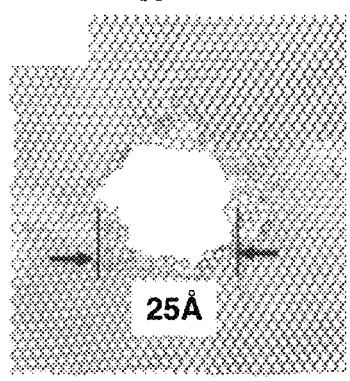

The size and morphology of pores is examined under different C60 energies (from 5 keV to 1 MeV), and bombardment angles (from 5° to 90°), and the substrate layer number (from one monolayer to five layers). As per molecular dynamic (MD) simulations, pore sizes are adjustable (FIG. 8A-8E). A 10 keV C60 at normal irradiation creates a pore of 6 Å on a monolayer (FIG. 8A). The pore is slightly increased to 15 Å under 100 keV bombardment (FIG. 8B). If the substrate changes from a monolayer to a bilayer, 100 keV bombardment can create a pore as large as 25 Å. A pore becomes bigger and elongates under tilted bombardment. A C60 molecule has a size (~7 Å) which is larger than an atom. Therefore its damage creation (for creating a nanopore) cannot be smaller than the C60 cage size. Its pore creation is deterministic (one C60 molecule will never miss creating a pore).

Figure 9:
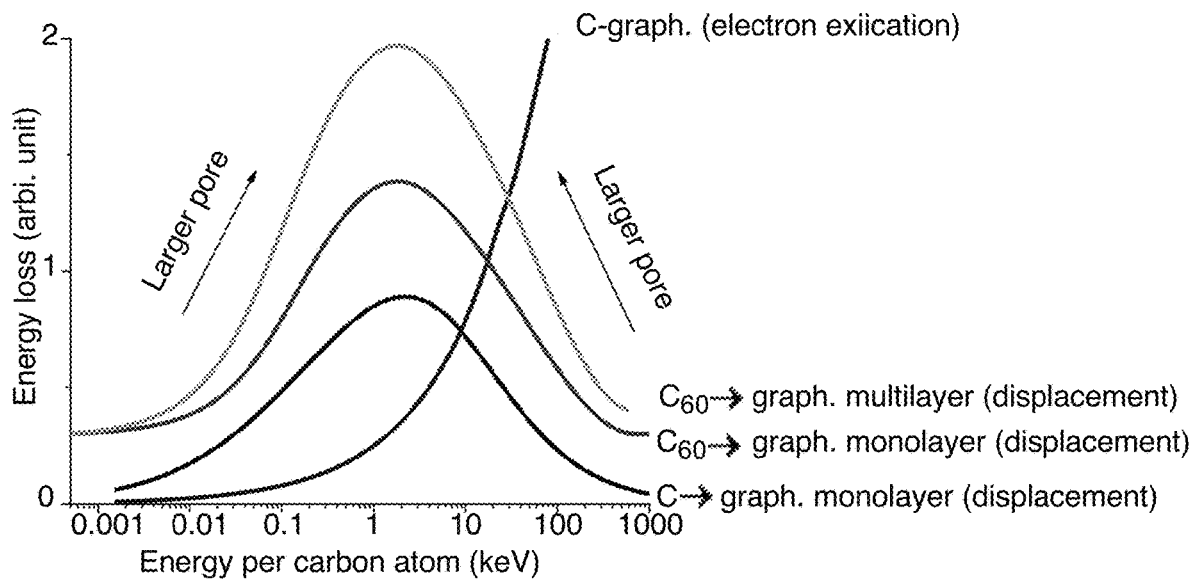
FIG. 9 Illustrates the simulated energy loss of $C_{60}$ and C monomer ions on graphene layers as a function of energy per carbon atom. Arrows point to the direction of increasing pore size. The pore sizes reach the maximum for the energy in the region of 1 to 10 keV per C atom (or equivalently, from 60 keV to 600 keV per molecule). For energies below 1 keV/C or above 10 keV/C, the pore sizes become smaller.

The pore size control mechanisms are illustrated in FIG. 9, showing the simulated energy loss of C vs. C60. For monomer C ions, the energy loss due to electron excitation (blue curve) does not create displacement. Its energy loss for nuclei-nuclei scattering (black curve) peaks at about 2 keV. For C60, this damage peak corresponds to 120 keV. Unlike monomer ions, at much lower (E<<120 keV) or much higher energy (E>>120 keV), C60 can still create nanopore with its sizes comparable to the molecule size (~7 Å). Note at such extreme energy regions, monomer C ions most likely penetrate through the graphene without collision. For C60, pore size changes occur when energy approaches peak damage, either from the low energy end or high energy end, as shown by the two arrows. Furthermore, a larger pore can be created on a substrate having multilayers of graphene, due to additional damage from damage cascades initialized from other graphene layers. The adjustability has been well demonstrated by MD simulations results shown in FIGS. 8A-8E. The flexibility in pore size control and the repeatability of the process demonstrate the uniqueness of the technique.

Pore Morphology Control

Figure 10:
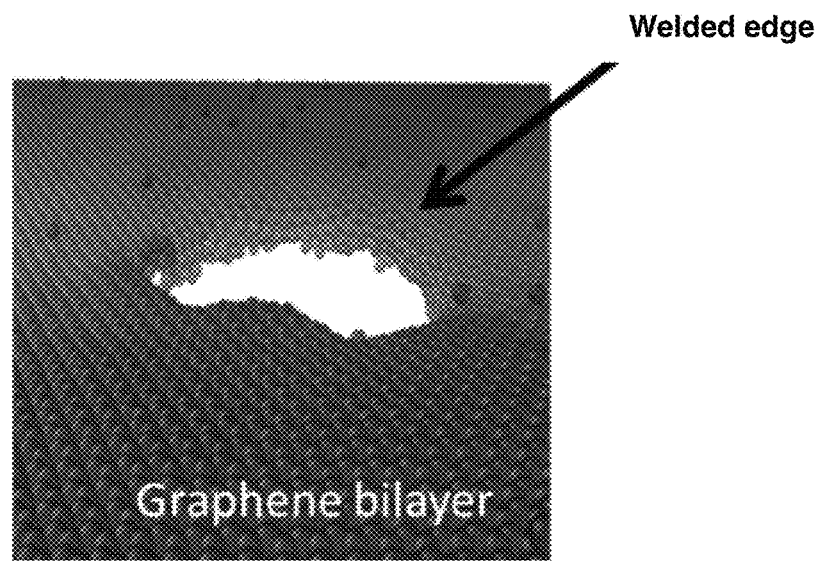
FIG. 10 is a molecular dynamics simulation-obtained nanopore after $C_{60}$ molecule penetration of a graphene bilayer. A smooth and welded edge is formed.

Molecular dynamics simulations show that nanopore edges of graphene bi-layers are "welded" during structural relaxation and rearrangements after molecule penetration. Carbon atoms on the pore edges of two touching graphene layers are re-bonded and form a structure like folded graphene. FIG. 10 shows a pore created by $C_{60}$ penetration through a bilayer. First, the pore edge is smooth and welded. Second, the pore is closer to a perfect circular shape. Such an atomically sharp and smooth edge is very important for device applications in comparison with a rough monolayer edge. In seawater desalination application, for example, a smooth edge means a high quality filtering. Otherwise, dangling bonds of a rough pore edge will easy interact with ions and molecules in waters, causing pore blockage.

Graphene Vs. Molybdenum Disulfide ($MoS_2$)

Graphene and molybdenum disulfide are compared for both pore formation and device efficiency. Most recently, it was shown that $MoS_2$ nanopores have better performance in DNA sequencing than graphene nanopore (8,9). Modeling suggests that nanopore $MoSi_2$ of specific pore architectures yields better water desalination (10). For both membrane types, there is an approach to mitigate the issues from growth defects by positioning one monolayer over another to form a bilayer, to minimize the leakage from initial cracks introduced in growth (11). As for the limitation from the difficulty of growing a large layer, it is feasible to use a channel/pore-contained substrate to catch flakes of graphene/$MoS_2$ dissolved in solutions (12). Solutions flow through a channel, driven under pressure, will deposit flakes over the channel. The flake blocking continues until all channeled are covered. The AAO template can be directly used for such a purpose.

Example 2

Seawater Desalination

In the seawater desalination device, the aluminum oxide film is used as the irradiation mask will be used as the substrate for seawater desalination. This is a great advantage in cost-saving and procedure simplification. The aluminum oxide contains tunnels of ≥40 nm in diameter. Previous studies have shown that supporting materials for graphene are critical to determine the maximum water pressure allowed. Graphene can survive a pressure as high as 100 bar if it sits on pores of 200 nm or smaller. For the device fabrication: 1) CVD graphene on copper (commercially available) is floated in APS-100 to remove the graphene on the backside of the copper. Then the sample is rinsed and dried and 2) the aluminum oxide film (with tunnels already formed) is pressed onto graphene/Cu. Then the whole structure is etched in APS-100, a copper etchant, to remove the copper.

Example 3

Gas Sensor and Graphene Field Effect Transistor

Figure 11A:
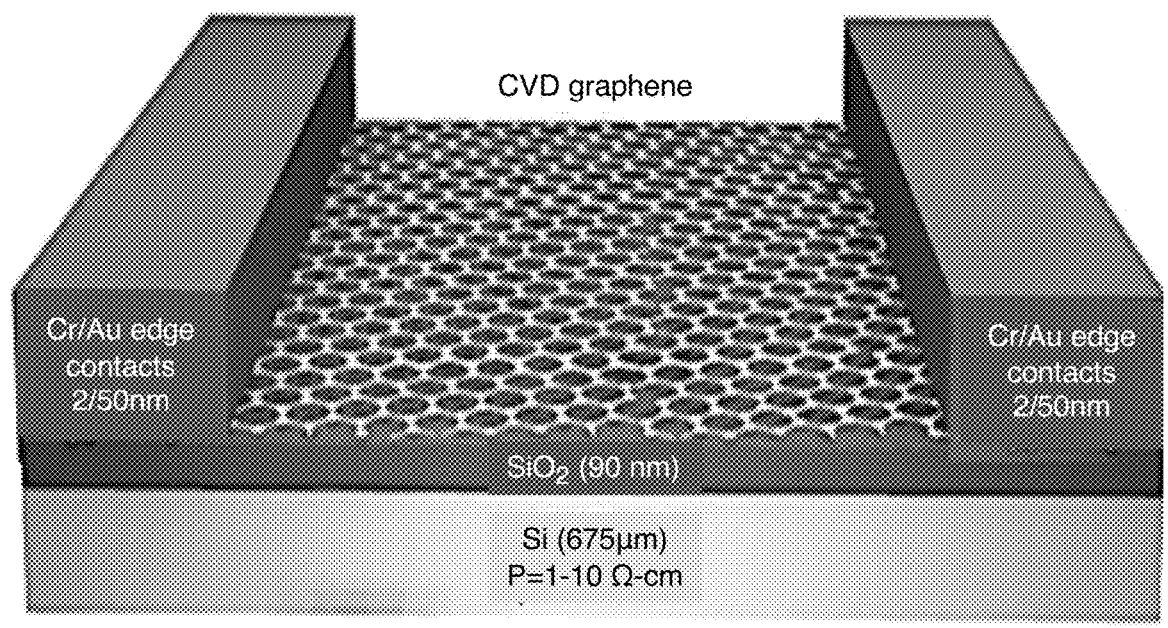
FIGS. 11A-11C show the application using graphene containing periodic nanopores to detect specific gas molecules. The graphene is used as the substrate of a graphene field effect transistor (FIG. 11A). Periodic nanopores are introduced on the graphene as trapping sites for gas molecules (FIG. 11B). The gas molecule trapping changes electronic property (resistivity) which can be used to identify gas molecules (FIG. 11C).
Figure 11B:
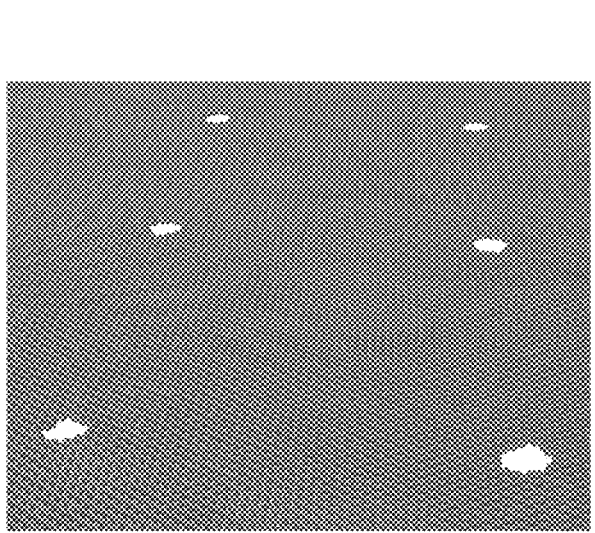
Figure 11C:
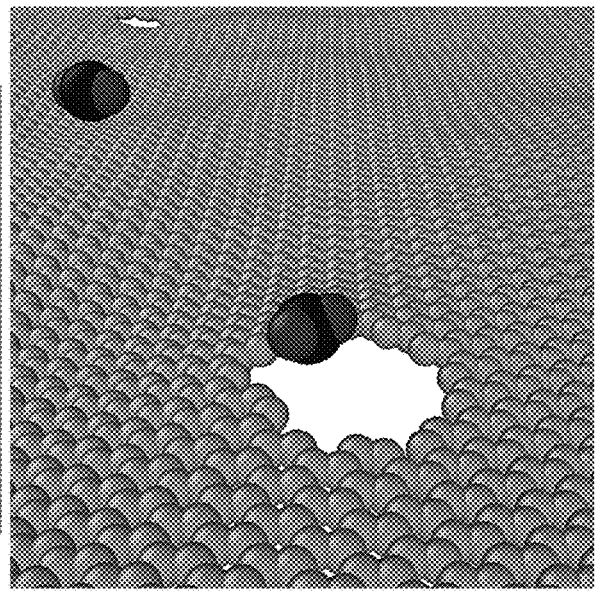

Miniaturized gas sensors of low power consumption can find a wide range of applications including indoor and outdoor air quality monitoring, occupational environmental monitoring, and industry alarming. The invention can be used to create graphene containing ordered nanopores, as the substrate of a graphene field effect transistor (GFET). GFET contains a source, drain, gate, and channel region made by graphene (FIG. 11A). GFET detects gas molecules by measuring characteristic device responses. Gas molecules can transfer either positive or negative charges, which change electron mobility, hole mobility, and carrier concentration. The measurement of such changes can detect and also differentiate different gas molecules. The present invention can be used to create nanopores on graphene substrate (FIG. 11B), which can significantly increase detection efficiency since nanopores are strong absorption sites for gas atoms (FIG. 11C). Furthermore, the nanopore arrays increase the repeatability of measurements and reduce the signal fluctuations between different devices.

REFERENCES

1. Human Development Report 2006: Beyond Scarcity-Power, Poverty and the Global Water Crisis. Basingstoke, United Kingdom, Palgrave Macmillan.
2. Cot et al. Solid Sate Sci. 2:313-334 (2000).
3 Lee et al. J. Membr. Sci. 370:1-22 (2011)
4. Cohen-Tanugi et al. Nano Lett. 12:3602-3608 (2012).
5. Masuda et al. Appl. Phys. Lett. 71:2770-2772 (1997).
6. Eller et al. Surface and Interface Analysis 43:484-487 (2011).
7. Chiba et al. Quantum Beam Sci. 4:13 (2020).
8. Liu et al. ACS Nano 8:2504-2511 (2014).
9. Farimani et al. ACS Nano 8:7914-7922 (2014).
10. Heiranian et al. Nat. Comm. 6:8616 (2015).
11. Homaeigohar, M. Elbahri, NPG Asia Materials 9, e427 (2017).
12. Wang et al. Nano Lett. 17:3081 (2017).
13. Thomas et al. Small 10:1453-1465 (2014).
14. Cohen-Tanugi et al. Desalination 366:59-70 (2015).
15 Zhao et al. J. Chem. Phys. 139:114702 (2013).
16. Schneider et al. Nano Lett 10:3163-3167 (2010).
17. Han et al. J. Am. Chem. Soc. 133:15264-15267 (2011).
18. Koenig et al. Nature Nanotechnology 7:728-732 (2012).
19. O'Hern et al. Nano Lett. 14:234-1241 (2014).
20. Wang et al. Nat. Nanotechnol. 7:552-554 (2012).
21. O'Hern et al. ACS Nano 6:10130-10138 (2012).
22. Bai et al. Nat. Nanotechnol. 5:190-194 (2010).
23. Safron et al. Adv. Mater. 24:1041-1045 (2012).
24. Guirguis et al. Mater. Horiz. 7:1218-1245 (2020).
25. P. Apel, Nucl. Instrum. Methods in Phys. Res. B 208: 11-20 (2003).
26. Vázquez et al. Carbon 114:511-518 (2017).
27. S. Plimpton, J Comp Phys, 117:1-19 (1995).
28. Masuda et al. Appl. Phys. Lett. 71:2770-2772 (1997).
29. H. Masuda and K. Fukuda, Science. 268:1466-1468 (1995).
30. C. K. Preston and M. Moskovits, J. Phys. Chem. 92:2957-2960 (1988).
31. Saito et al. Appl. Phys. Lett. 55:607-609 (1989).
32. Thongmee et al. Journal of Magnetism and Magnetic Materials. 321:2712-2716 (2009).
33. Poinern et al. Materials. 4:487-526 (2011).
34. E. Choudhary and V. Szalai, RSC Adv. 6:67992-67996 (2006).
35. Qi et al. Nanoscale 4:5989 (2012).
36. dos Santos et al. Phys. Rev. Lett. 99:256802 (2007).
37. Gorbachev et al. Phys. Rev. Lett. 98:176805 (2007).
38. Papageorgiou et al. Progress in Materials Science 90:75-127 (2017).
39. Lee et al. Science 321:385-388 (2008).
40. Stuart et al. J of Chem Phys. 112:6472-6486 (2000).
41. Bacon, Acta Cryst. 4:558-561 (1951).
42. J. Tersoff, Phys Rev B. 39:5566-5568 (1989).
43. Ziegler et al. Oxford: Pergamon Press; 1985.
44. Heiranian et al. Nat. Comm. 6:8616 (2015).
45. Wu et al. J. Phys. Chem. B 117:8802-8813 (2013).
46. Rosenberg et al. J. Gen. Physiol. 72:341-350 (1978).
47. J. W. Mayer and E. Rimini, Ion Beam Handbook for Material Analysis, Academic Press, New York, 1977.
48. Feldman et al. Material Analysis by Ion Channeling, Academic Press, New York, 1982.
49. 75 breakthroughs by the U.S. Department of Energy's National Laboratories, published by the Lawrence Livermore National Laboratory Public Affairs, 2017.
50. Kim et al. Journal of Nuclear Materials. 527:151818 (2019).
51. Singh et al. Journal of Applied Physics. 126:175901 (2019).
52. Kim et al. Materials 12:3343 (2019).
53. Kim et al. Journal of Nuclear Materials 509:504-512 (2018).
54. Hoang et al. Nuclear Instruments and Methods in Physics Research Section B: Beam Interactions with Materials and Atoms 427:9-13 (2018).
55. Wang et al. Crystals. 9:252 (2019).
56. Kim et al. Journal of Nuclear Materials, 544:152771 (February 2021).

57. Ryabikovskaya et al. Journal of Nuclear Materials, 543:152585 (January 2021).
58. Jiangyuan Fan, A new multiscale algorithm and the framework of code systems for advanced defect cluster dynamics simulations, PhD dissertation, 2019, Texas A&M University
59. Hyosim Kim, Dispersoid Stability Ion Irradiated Oxide Dispersion Strengthened Alloys, PhD dissertation, 2019, Texas A&M University.
60. Ekaterina Ryabikovskaya, Studies on Swelling Resistance of Pure Chromium as a Fuel Cladding Material, M.S. thesis, 2020, Texas A&M University.

What is claimed is:

1. A method for creating at least one nanopore on a membrane, comprising:
    fabricating a mask with at least one nanotunnel therethrough;
    placing the mask over the membrane that has one to five monolayer;
    adjusting a bombardment energy of charged C60 molecules and adjusting an incident angle of bombardment thereof to 5 degrees to less than 20 degrees away from a nanotunnel axis, an adjusted bombardment energy and an adjusted incident angle determined by a number of the monolayers, to control a size of the at least one nanopore;
    bombarding the mask with the charged C60 molecules at the adjusted bombardment energy and the adjusted incident angle such that one C60 molecule enters one nanotunnel, each of said C60 molecules colliding with an inner wall of the nanotunnel at least once whereby said adjusted bombardment energy and adjusted incident angle prevent crushing or deforming of the C60 molecule; and
    bombarding the membrane with each of the charged C60 molecules after passing through the at least one nanotunnel, to create the at least one nanopore thereon.

2. The method of claim 1, said fabricating step comprising:
    forming at least one convex on a mold;
    molding the mold onto a substrate; and
    anodizing at each convex to form the at least one nanotunnel.

3. The method of claim 2, wherein the mold comprises silicon carbide, boron nitride, diamond, stainless steel, glass, a metallic glass, quartz, alumina, or silica.

4. The method of claim 1, wherein the nanotunnels are fabricated in a random pattern or as an array.

5. The method of claim 1, wherein the bombardment energy ranges from about 100 eV to about 10 MeV.

6. The method of claim 1, wherein the membrane is a graphene membrane or a molybdenum disulfide membrane.

7. The method of claim 1, wherein the nanotunnel has a width of about 0.1 nm to about 1 micron.

8. The method of claim 1, wherein the mask has a thickness of about 1 nm to about 1 mm.

9. The method of claim 1, wherein the nanotunnel has an aspect ratio of about 1 to about 10000.

10. The method of claim 9, wherein the nanotunnel has an aspect ratio of about 150.

11. A two dimensional membrane with at least one nanopore thereon fabricated via the method of claim 1.

12. The two dimensional membrane of claim 11, wherein the nanopores are fabricated in a random pattern or as an array on the two dimensional membrane or wherein the two dimensional membrane is fabricated with a single nanopore.

13. The two dimensional membrane of claim 11, wherein the membrane is selected from the group consisting of a single layer graphene membrane, a bilayer graphene membrane and a bilayer molybdenum disulfide membrane.

* * * * *